United States Patent
Grosser et al.

(10) Patent No.: US 10,282,265 B2
(45) Date of Patent: May 7, 2019

(54) VERIFYING A GRAPH-BASED COHERENCY VERIFICATION TOOL

(71) Applicant: INTERNATIONAL BUSINESS MACHINES CORPORATION, Armonk, NY (US)

(72) Inventors: Thomas P. Grosser, Tuebingen (DE); Gerrit Koch, Ammerbuch (DE); Ralf Winkelmann, Holzgerlingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 117 days.

(21) Appl. No.: 14/929,741

(22) Filed: Nov. 2, 2015

(65) Prior Publication Data
US 2016/0132417 A1    May 12, 2016

(30) Foreign Application Priority Data
Nov. 12, 2014  (GB) .................................. 1420116.4

(51) Int. Cl.
*G06F 11/00* (2006.01)
*G06F 11/26* (2006.01)
(Continued)

(52) U.S. Cl.
CPC .......... *G06F 11/261* (2013.01); *G06F 11/263* (2013.01); *G06F 11/3608* (2013.01);
(Continued)

(58) Field of Classification Search
CPC .. G06F 11/261; G06F 11/263; G06F 11/3684; G06F 12/084; G06F 12/0811;
(Continued)

(56) References Cited

U.S. PATENT DOCUMENTS 6,285,974 B1    9/2001    Mandyam et al.
7,000,079 B2    2/2006    Detjens et al.
(Continued)

FOREIGN PATENT DOCUMENTS

CN    103150264 A    6/2013

OTHER PUBLICATIONS

Kaiyu Chen, Sharad Malik and Priyadarsan Patra, "Runtime Validation of Memory Ordering Using Constraint Graph Checking", 2008 IEEE.*
(Continued)

*Primary Examiner* — Yair Leibovich
(74) *Attorney, Agent, or Firm* — Steven Chiu; Matthew M. Hulihan; Heslin Rothenberg Farley & Mesiti PC

(57) ABSTRACT

Verification is provided of a functional correctness of a graph-based coherency verification tool for logic designs of arrangements of processors and processor caches, the graph-based coherency verification tool using trace files as input for verifying memory ordering rules of a given processor architecture for accesses to the caches, wherein nodes in a graph represent memory accesses and edges represent dependencies between them. The verifying includes (i) providing a specification of a test case for a self-checking tool, the test case comprising a sequence of statements in a high-level description language format, representing memory access events and system events; and (ii) generating trace files with the self-checking tool for the graph-based coherency verification tool by producing permutations of trace events, which are defined by the sequence of statements of the test case.

19 Claims, 9 Drawing Sheets

(51) Int. Cl.
- *G06F 12/084* (2016.01)
- *G06F 12/0811* (2016.01)
- *G06F 12/0815* (2016.01)
- *G06F 11/263* (2006.01)
- *G06F 17/50* (2006.01)
- *G06F 11/36* (2006.01)

(52) U.S. Cl.
CPC ........ *G06F 12/084* (2013.01); *G06F 12/0811* (2013.01); *G06F 12/0815* (2013.01); *G06F 17/509* (2013.01)

(58) Field of Classification Search
CPC .......... G06F 12/0815; G06F 2212/283; G06F 2212/621; G06F 17/509
USPC .......................................................... 714/42
See application file for complete search history.

(56) References Cited

U.S. PATENT DOCUMENTS

| | | | |
|---|---|---|---|
| 7,814,378 B2 | 10/2010 | Manovit et al. | |
| 2002/0144185 A1* | 10/2002 | Farago | G06F 11/261 714/42 |
| 2002/0166032 A1 | 11/2002 | Qadeer | |
| 2004/0003184 A1* | 1/2004 | Safranek | G06F 12/082 711/146 |
| 2005/0247774 A1* | 11/2005 | Sander | G06F 9/3826 235/375 |
| 2009/0307660 A1* | 12/2009 | Srinivasan | G06F 8/314 717/114 |
| 2011/0167412 A1 | 7/2011 | Khalon et al. | |
| 2015/0095008 A1* | 4/2015 | Wang | G06F 11/3608 703/20 |

OTHER PUBLICATIONS

Meixner et al., "Dynamic Verification of Memory Consistency in Cache-Coherent Multithreaded Computer Architectures", IEEE Transactions on Dependable and Secure Computing, vol. 6, No. 1, Jan.-Mar. 2009, pp. 18-31.

Chen et al., "Runtime Validation of Memory Ordering Using Constraint Graph Checking", IEEE, 2008, pp. 415-426.

List of IBM Patents or Applications Treated as Related, Jan. 8, 2018, pp. 1-2.

"Verifying a Graph-Based Coherency Verification Tool", U.S. Appl. No. 15/863,186, filed Jan. 5, 2018, pp. 1-39.

* cited by examiner

VERIFYING A GRAPH-BASED COHERENCY VERIFICATION TOOL

PRIOR FOREIGN APPLICATION

This application claims priority from United Kingdom patent application number 1420116.4, filed Nov. 12, 2014, which is hereby incorporated herein by reference in its entirety.

BACKGROUND

Aspects described herein relate in general to data processing systems, and in particular, to a method and a system for verifying a functional correctness of a graph-based coherency verification tool.

Verification of coherence for shared cache components in a system verification environment may involve performing coherency checks to verify that stores to a given data location are serialized in some order and no processor of the multiprocessor system is able to observe any subset of those stores as occurring in a conflicting order.

The coherency checks make use of the cache functional simulator to simulate various levels of cache in the multiprocessor model. Stores to the cache, i.e. store events, are applied to the cache functional simulator in the order that they occur in the trace information from the canonical tracers. However, rather than updating the cache simulator with the actual data stored, the performed time of the store event is applied to the simulator as data.

The cache simulator stores the latest performed time for each byte of each cache line in the simulated cache, in an associated data structure. In this way, the age of the data associated with any byte in the cache at any one time during the trace is determined from the performed times stored for each byte of the simulated cache.

The magnitude of the performed time is used as an indication of the global age, or the global serialization order, of the data stored. A comparison of the performed times of store events is used to verify coherency across all of the processors of the multiprocessor system.

In addition to store events, the trace information includes load events. For each load event that is encountered during traversing of the trace information, a comparison is made between a global expected data age of the data in the cache and the performed time of the data in the cache at the cache location referenced by the load event. The expected data age is the latest data age seen by any previous load event in the trace information. That is, the expected data age is the latest performed time identified in a previous check of a load event.

The comparison of the global expected data age of the data and the performed time associated with the data location referenced by the load instruction involves checking that the performed time is greater than or equal to the global expected data age. Stated differently, the check is to ensure that the performed time, or data age in the simulated cache, is not less than the global expected data age, i.e. the latest previously encountered data age. If the data age in the simulated cache is less than the latest previously encountered data age, then a cache coherency violation has occurred.

SUMMARY

Shortcomings of the prior art are overcome and additional advantages are provided through the provision of a computer-implemented method that includes verifying a functional correctness of a graph-based coherency verification tool for logic designs of arrangements of processors and processor caches, the graph-based coherency verification tool using trace files as input for verifying memory ordering rules of a given processor architecture for accesses to the caches, where nodes in a graph represent memory accesses and edges represent dependencies between the nodes. The verifying includes providing a specification of a test case for a self-checking tool, the test case including a sequence of statements in a high-level description language format, representing memory access events and system events. The verifying further includes generating trace files with the self-checking tool for the graph-based coherency verification tool by producing permutations of trace events, which are defined by the sequence of statements of the test case.

Further, a system is provided that includes a memory and a processor in communication with the memory, where the computer system is configured to perform a method. The method includes verifying a functional correctness of a graph-based coherency verification tool for logic designs of arrangements of processors and processor caches, the graph-based coherency verification tool using trace files as input for verifying memory ordering rules of a given processor architecture for accesses to the caches, where nodes in a graph represent memory accesses and edges represent dependencies between the nodes. The verifying includes providing a specification of a test case for a self-checking tool, the test case including a sequence of statements in a high-level description language format, representing memory access events and system events. The verifying further includes generating trace files with the self-checking tool for the graph-based coherency verification tool by producing permutations of trace events, which are defined by the sequence of statements of the test case.

Yet further, a computer program product is provided that includes a computer readable storage medium readable by a processor and storing instructions for execution by the processor for performing a method. The method includes verifying a functional correctness of a graph-based coherency verification tool for logic designs of arrangements of processors and processor caches, the graph-based coherency verification tool using trace files as input for verifying memory ordering rules of a given processor architecture for accesses to the caches, where nodes in a graph represent memory accesses and edges represent dependencies between the nodes. The verifying includes providing a specification of a test case for a self-checking tool, the test case including a sequence of statements in a high-level description language format, representing memory access events and system events. The verifying further includes generating trace files with the self-checking tool for the graph-based coherency verification tool by producing permutations of trace events, which are defined by the sequence of statements of the test case.

Additional features and advantages are realized through the concepts of the present invention. Other embodiments and aspects of the invention are described in detail herein and are considered a part of the claimed invention.

BRIEF DESCRIPTION OF THE DRAWINGS

Embodiments of the present invention together with objects and advantages may best be understood from the following detailed description of the embodiments, but not restricted to the embodiments, wherein is shown in.

DETAILED DESCRIPTION

Figure 1:
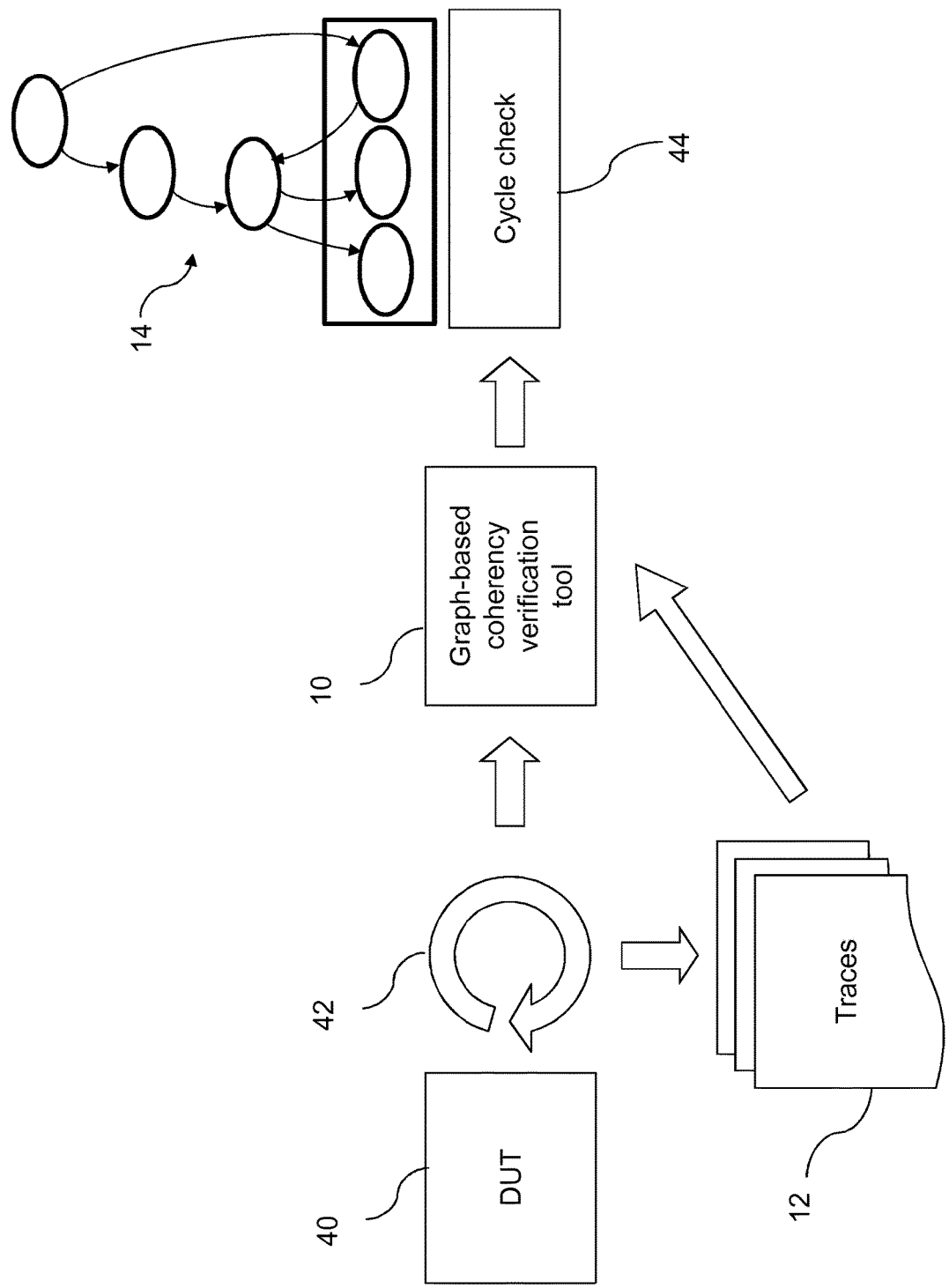
FIG. 1 depicts an overview of a graph-based coherency verification flow in accordance with aspects described herein.

A potential challenge of coherency verification is that a memory is shared among different levels of cache. Multiple hardware threads of the processor can load or store to a cache line. A simulation captures the observed ordering of cache accesses, which are written to a trace file. These events represent the ordering of memory accesses, which is to conform to the memory ordering rules of the architecture.

Graph-based coherency verification is a method that relies on finding cycles in a directed graph with a post-process checking tool. The graph represents the system-wide storage access ordering. It can be built by a computer program based on simulation traces, wherein a node is a storage access, and an edge is an ordering relationship between two nodes. This verification method relies on correctness of the graph building program. Assuming there's a coherency problem in the hardware, but the graph has been constructed incorrectly due to a missing edge, no cycle exists in the graph. This hardware problem would not be detected.

In graph-based coherency verification, the correctness of the graph building program is normally only addressed by code reviews and selective regression tests. State exploration is limited, if based on simulation throughput and quality of test case generation.

Aspects described herein can address this by way of a self-checking tool, which uses test cases, specified in a high-level description language format (HLD), in order to generate several trace files for the graph-based coherency verification tool in an automated manner. A set of low-level trace events is generated for each corresponding event of the high-level description language format. The sum of all high-level events results in a generation of all possible permutations of low-level trace events, thus ensuring correctness of the graph-building program.

The HLD input language comprises the events that constitute coherency checking In general, the HLD language defines Fetch and Store, which represents a read and write of a portion of the cache line, respectively. The Fetch of an entire cache line into the memory hierarchy is called a Nest Fetch. This event defines the ownership state of the cache line and carries data of the cache line. To invalidate a cache line, or change the ownership state of the cache line, the event Cross-Invalidate (XI) is used, e.g. demoting a line from exclusive to read-only. An entire cache line can be promoted again. In that sense, only the ownership state has changed, not the data. There are other special events as well, that play a role in the checking, e.g. serializing instructions, that force write-back of dirty data, or transactional execution, where a block of instructions is executed block-concurrent, as observed by other CPUs.

Coherency events, like Load and Store instructions, Nest Fetches, and Cross Invalidates (XI) are specialized by commands and corresponding responses. Architectural coherency rules and violations are not expressed by using specialized commands and responses.

Aspects described herein generate all permutations of specialized events systematically in an automated manner, and write them to several trace files. The graph-based coherency checking tool processes the just generated trace files and is to return the exact same result, i.e. reporting a cycle in the graph. This ensures correctness of the graph building program.

The graph-based coherency verification tool may be a tool intended for using trace files of simulations of logic descriptions as input.

The trace events may comprise at least one of a system event, an instruction, μ-operations, a Fetch command, a store command, a cross invalidate command, Nest Fetch command, wherein those statements modify a portion of a cache line. Thus, statements of types Fetch and Store represent a read and write of a portion of a cache line respectively, whereas statements of type Nest Fetch represent the Fetch of a cache line into the memory hierarchy, and statements of type cross invalidate represent the invalidation of a cache line or a change of the cache line state, e.g. by changing the ownership of an entire cache line.

In an embodiment, the HLD test case defined may be a failing scenario. An example method is based on the feature that a user describes a failing scenario in a high-level description, which contains several events that lead to the error.

Thus, in an embodiment, the method after providing a test case in a high-level description (HLD) language format, may comprise (i) parsing a high-level description (HLD) file (also interchangeably referred to herein as a high-level design file) to a matrix data structure of the test case; (ii) expanding the parsed high-level description file (matrix) to create permutations of trace events, stored in a table data structure, and returning the table data structure; and (iii) iterating over the created matrix data structure and the table data structure such that the high-level description file expands to several trace files, each comprising several trace events, where each trace event is created for each row of the originating HLD file.

Parsing a high-level description file may favorably comprise (i) reading the high-level description file; (ii) processing the trace events and reading corresponding attributes; and (iii) returning a matrix data structure of trace events and corresponding attributes.

Expanding the parsed high-level description file (i.e. matrix) to create variations of trace events may favorably comprise (i) evaluating the trace events and attributes for each row of the matrix; (ii) creating all possible permutations for each individual trace event of the matrix; and (iii) creating a table data structure from all combinations of the supplied permutations for each trace event, and returning the table data structure where one row is containing one permutation for all events of the high-level description file.

Iterating the expanded permutations for the high-level description/design file may comprise (i) iterating over the table in an outer loop by creating one trace file for each row of the table of the expanded matrix; and (ii) iterating over each row of the matrix in an inner loop by creating the detailed trace events for each row of the matrix, which are later input to the graph-based coherency verification tool. The inner loop is creating specialized trace events for each row of the matrix, where the assigned values are provided by the outer loop that iterates over each row of the table; and writing the trace sequence to a trace file, which is input to the graph-based coherency verification tool.

All permutations may be created, if no specific attributes in a trace event of the HLD file are defined. This allows an automated state space exploration, based on a high-level description of a test case.

The following are example attributes defined for fetch and store instructions, which correspond to read/write access to the lowest level cache:

Absolute memory address, that is, a base address, a byte offset, and a length.

Time stamp of the cache access. With respect to a fetch instruction this is the time when data is read from the processor pipeline. With respect to a store instruction this is the write-back time, with data being written to the lowest level cache, thus representing the age of the data.

Time stamp of the completion of the instruction, since completion has to be in order, while cache accesses and execution may be out-of-order due to performance reasons.

Unique sequence identifier of the instruction, to recognize instructions that may include several micro-operations (μ-ops), and being able to build up a nodal hierarchy in the graph. The hierarchy in the graph is a concept to represent atomic instructions.

An identifier of the thread or core the event was observed on.

Fetch instructions do require the definition of the data source, i.e. telling where the Fetch got the data from, e.g. coming from a specific cache line or forwarded from an older Store.

The architecture in some example does not specify how data gets loaded into caches and how many levels of cache there are. At the micro-architecture level, there are events that modify the cache line. Those cache line events may also be necessary for coherency and consistency checking, e.g. a cache line was fetched, before an instruction can access it. Likewise, a cache line may be in exclusive state, before an instruction can store to it. Thus, there may be an ordering based on the attributes of the cache line events Nest Fetch (NF) and Cross-Invalidate (XI). The following attributes may be mandatory for these events:

Time stamp at the interface of the CPU core, which is defined to be the coherency time that defines the age of the event. This "age" is represented by ordering the events based on their time.

The absolute memory address of the entire cache line.

Since these events represent the implementation of the coherency protocol, there are several commands and responses that change the state of the cache line at the micro-architecture level. For example, a cache line may be invalid, read-only, or in exclusive state. For example, a transition of the state of an individual cache line may be: invalid (INV)→read only (RO), RO→exclusive (EX), EX→RO, etc. Since the event modifies the state of the cache line, a "type" attribute may be used in the HLD to specify how the cache line will be modified.

All permutations may be created if no specific attributes in a trace event of the HLD file are defined. This allows an automated state space exploration, based on a high-level description of a test case.

According to a further aspect described herein, a self-checking tool for performing a method as described is proposed, including (i) reading a test case comprising a sequence of statements in a high-level description language format, representing memory access events and system events; and (ii) generating trace files for a graph-based coherency verification tool by producing all possible permutations of trace events, which are defined by the sequence of statements in the test case.

Example methods may be based on a feature that a computer hardware design specialist describes a failing scenario in a high-level description (HLD), which contains several events that lead to an error. The self-checking tool according to aspects described herein evaluates each event in order to create all permutations based on the attribute settings. If specific attributes are not defined, this is an indication to the self-checking tool to create all permutations. Likewise, if certain attributes have to be defined, the total number of created permutations may be reduced. In general, this idea can be applied to any of the attributes defined herein. Some examples of how attributes expand may be, amongst others:

A missing "type" of Nest Fetch events will expand all valid commands and responses.

A Nest Fetch "type" set to read-only will expand all valid read-only commands and according responses.

A missing "thread identifier" of instruction events (i.e. Fetch and Store) will create permutations such that all threads are checked.

In the drawings, like elements are referred to with equal reference numerals. The drawings are merely schematic representations, not intended to portray specific parameters of embodiments of the invention. Moreover, the drawings are intended to depict only example embodiments of the invention and therefore should not be considered as limiting the scope of the invention.

FIG. 1 depicts an overview of a graph-based coherency verification flow in accordance with aspects described herein. An example simulation flow with a post-process checking tool, that is a graph-based coherency verification tool 10, is shown. A device under test (DUT) 40 is simulated by a simulation tool 42, which generates traces being stored in a trace file 12. Traces hereby comprise system events, instructions, fetch, store, etc. The DUT 40 is verified with the graph-based coherency verification tool 10, which reports pass or fail and provides a set of logs to debug. The simulation tool 42 triggers the execution of the graph-based coherency tool 10, and the trace file 12 is fed into the graph-based coherency verification tool 10, which generates graphs 14. These graphs 14 will be checked for cycles in the cycle check 44 in order to reveal inconsistencies or failures in the DUT 40.

Figure 2:
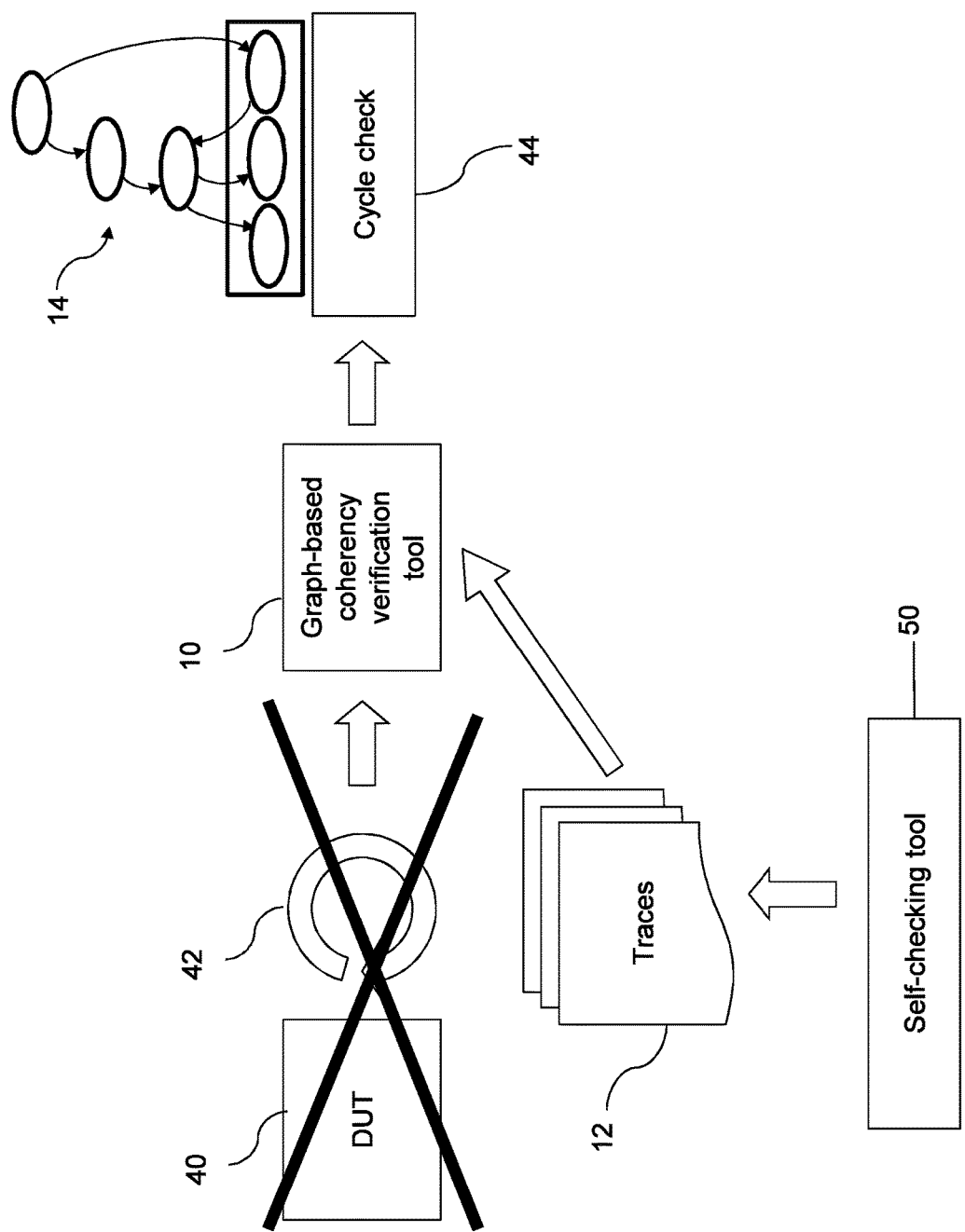
FIG. 2 depicts an overview of a self-checking flow according to an embodiment of the invention.

FIG. 2 gives an overview of a self-checking flow according to an embodiment of the invention. A simulation of the DUT 40 by the simulation tool 42, which is perhaps lengthy, is no longer used according to this embodiment.

The self-checking tool 50 enables to produce short errors in small graphs. It operates on failing scenarios defined in a high-level description language, particularly defined in test cases 20 (see FIG. 6). A benefit may be that this method is much faster than the simulation, and an automated state space exploration based on the HLD (i.e. high-level description) test case is performed. Thus it verifies the correctness of the graph-based coherency verification tool 10 and can significantly improve the overall quality of the graph-based verification method. The self-checking tool 50 creates traces in an automated manner stored in the trace file 12 which again is used as input for the graph-based coherency verification tool 10 instead of information generated by simulation (as before).

Figure 6:
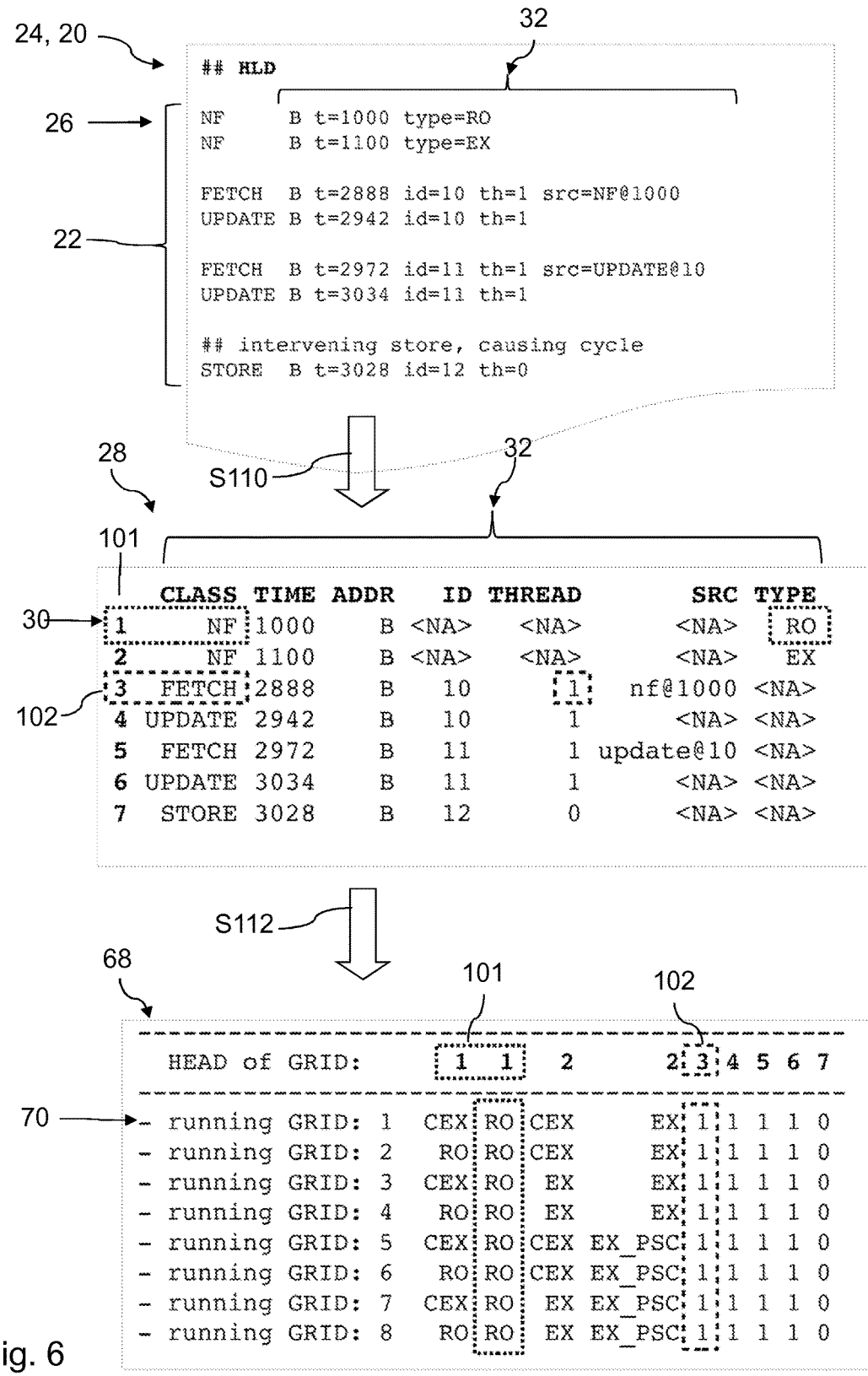
FIG. 6 depicts details of an implementation flow according to an embodiment of the invention.

Reference numerals not shown in FIG. 2 may be found in FIG. 6.

A example method for verifying a functional correctness of a graph-based coherency verification tool 10 for logic descriptions of arrangements of processors and processor caches, where the graph-based coherency verification tool 10 is using trace files 12 as input for verifying memory ordering rules of a given processor architecture for accesses to the caches, and wherein nodes 16 in a graph 14 (see, e.g., FIG. 3, FIG. 4) represent memory accesses and edges 18 (see, e.g., FIG. 3, FIG. 4) represent dependencies between them, comprises (i) providing a specification of a test case 20 for the self-checking tool 50, the test case 20 being a sequence of statements in a high-level description language format, representing memory access events and system events. The method further comprises (ii) generating trace files 12 with the self-checking tool 50 for the graph-based coherency verification tool 10 by producing all possible permutations of trace events 22, which are defined by the attributes in the test case 20, and writing them to the trace file 12. The graph-based coherency verification tool 10 may still be the same tool intended for using trace files 12 of simulations 42 of logic descriptions as input (as in FIG. 1), but instead may be fed by trace files 12 generated by the self-checking tool 50 (as in FIG. 2). Example trace events 22 comprise at least one of a system event, an instruction, μ-operations, a Fetch command, a Store command, a cross invalidate command, Nest Fetch command, wherein statements of types Fetch and Store represent a read and write of a portion of a cache line respectively, statements of type Nest Fetch represent the Fetch of an entire cache line into the memory hierarchy, and statements of type cross invalidate represent the invalidation of a cache line or a change of the cache line state.

The self-checking tool 50 may include/perform (i) reading a test case 20 comprising a sequence of statements in a high-level description language format, representing memory access events and system events; and (ii) generating trace files 12 for the graph-based coherency verification tool 10 by producing all possible permutations of trace events 22, which are defined by the attributes in the test case 20.

Figure 3:
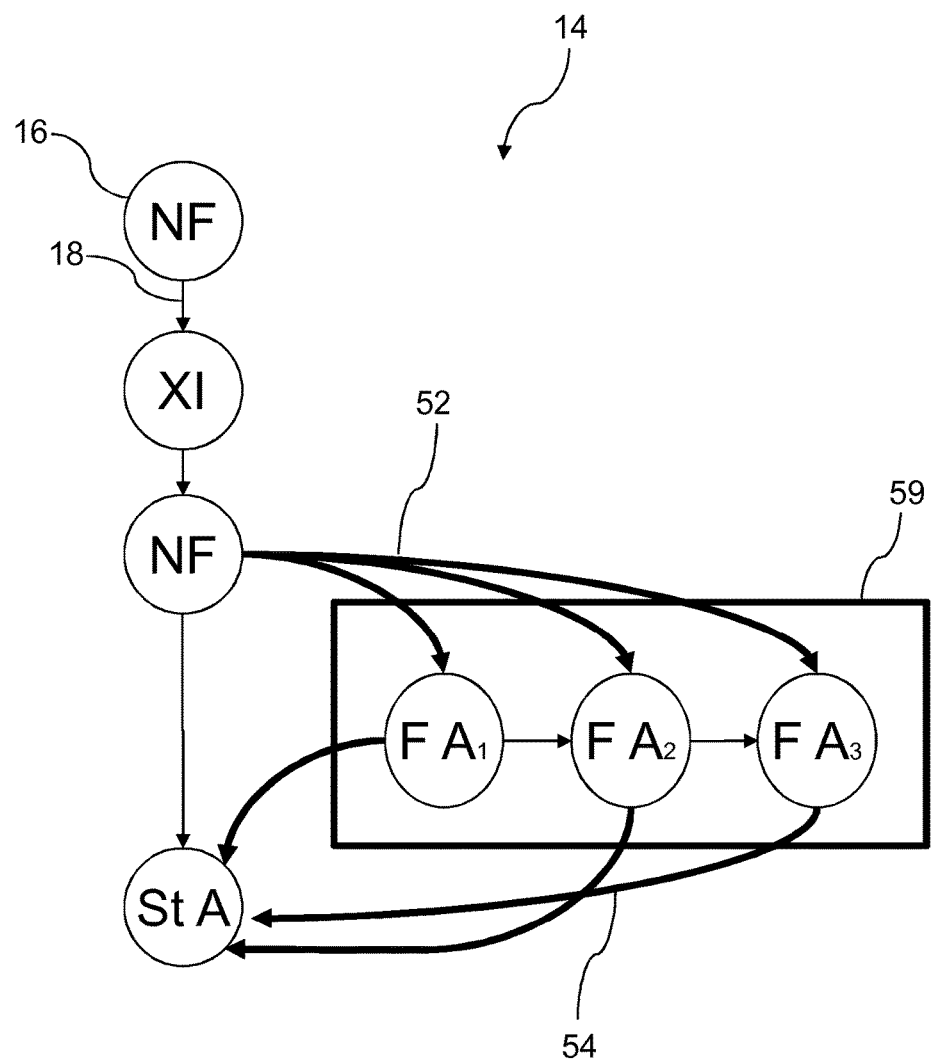
FIG. 3 depicts a graph example with a correct behavior at instruction level, in accordance with aspects described herein.

FIG. 3 depicts a graph example 14 with a correct behavior at instruction level in accordance with aspects described herein, that is, correct because there is no cycle in the graph. The graph 14 includes a number of nodes 16 and edges 18, arranged in a specific ordering, which complies with the memory ordering rules of the computer architecture, wherein nodes 16 in a graph 14 represent memory accesses and edges 18 represent dependencies between them. Edges represent the individual storage rules. Edges 18 represent the ordering of global data consistency for store operations, i.e. operations that modify the state or data of the cache line. Edges 52 are consumer edges or data provider edges, i.e. data provided by the Nest Fetch (NF) is consumed by the Fetch (F) operations. Edges 54 represent an ordering of global data consistency for fetch operations, such that the fetch has to be ordered before the future update of the cache line. In FIG. 3 a first Nest Fetch event 16 is shown, followed by an XI and a second Nest Fetch event. The XI event implies that the cache line was removed. The following second NF implies that the cache line was fetched again. The edges 52 show that the data flows at the instruction level 59 from the provider (i.e. second NF) to the individual fetch events ($FA_1$, $FA_2$, $FA_3$). The fetches itself are ordered before the Store (ST) by the edge 54. The Store is the next update of the data. All fetches read new data which is the correct behavior, that is, none of the fetch operations reads old data.

Figure 4:
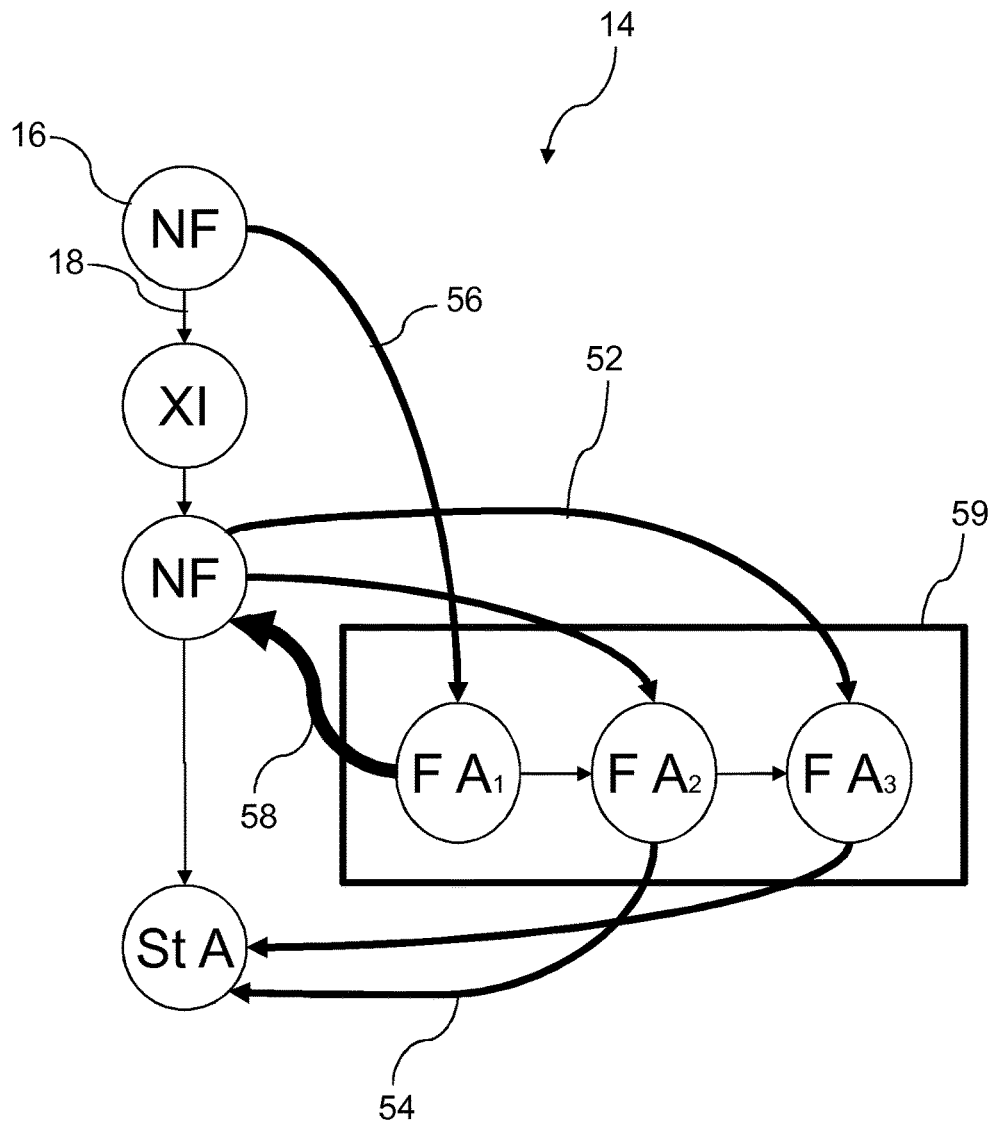
FIG. 4 depicts a graph example with a faulty behavior at instruction level, in accordance with aspects described herein.

Contrarily, FIG. 4 shows a graph example 14 with a faulty behavior at instruction level in accordance with aspects described herein. In this case, a single fetch operation ($FA_1$) of the instruction 59 is consuming old data 56, which is a failure as the data might have been modified by another core, as it was modified due to the XI, which deleted the line temporarily. Because of the data source 56 the next update has to be edge 58 for that particular fetch event. As one of the fetches now reads old data but the other fetches ($FA_2$, $FA_3$) read new data, an inconsistency of the storage becomes visible with a cycle in the graph.

Figure 5:
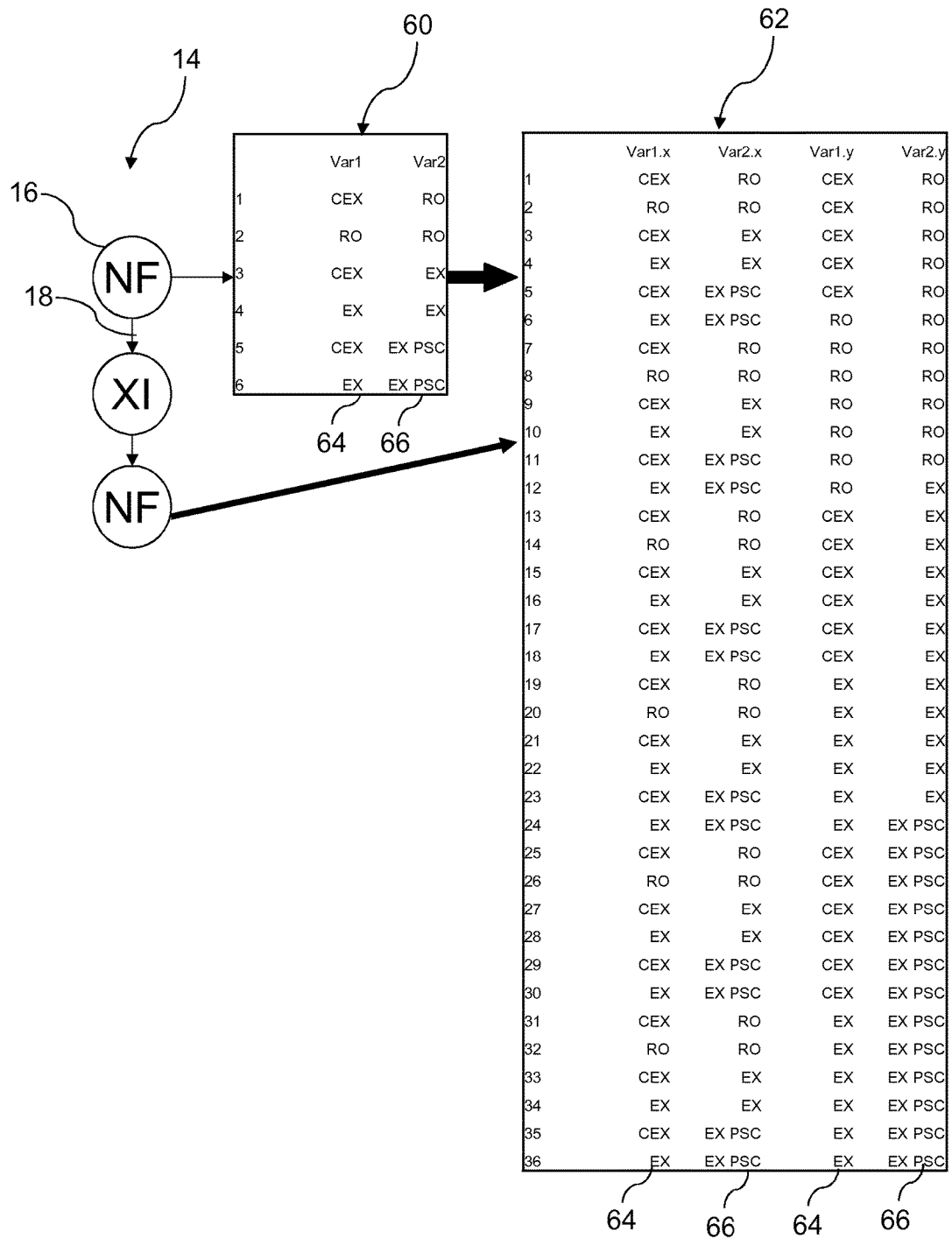
FIG. 5 depicts an example showing permutations of abstract high-level events according to an embodiment of the invention.

FIG. 5 depicts an example showing permutations of abstract high-level events according to an embodiment of the invention. The graph 14 shows a set of nodes 16 and edges 18 with abstract NF and XI commands. In the corresponding event tables 60 and 62 several type and status fields are displayed exhibiting commands 64 and corresponding responses 66, initiated by the events NF. In the event table 60 all valid NF states with 6 combinations per NF is shown, whereas in table 62 the valid states for the combination of the two NF events, which results in 6×6=36 combinations, are shown. As exemplified in this figure, high-level description test cases 20 that use two NF events without specifying a concrete type will expand the permutations shown in table 62. Beneficially, all permutations may be created, if no specific attributes in a trace event of the HLD file are defined. This allows an automated state space exploration, based on a high-level description of a test case.

In FIG. 6, details of an implementation flow for processing a test case 20 according to an embodiment of the invention is shown. The test case 20 defined is a failing scenario, leading to a cycle in the graph if processed with the graph-based coherency verification tool 10. The method, after specification of the test case 20 in a high-level description language format, comprises (i) at S110, parsing a high-level description file 24 to an in-memory matrix data structure 28 of the test case 20; (ii) at S112, creating permutations of trace events 22, based on the attributes 32 defined in the HLD 24, and expanding a table data structure 68; and finally (iii) iterating over each expanded table row 70 and each matrix row 30 in order to create a trace file 12. As an example, the statements 101, 102 in any of the rows 30 of the matrix 28 are expanded with all possible permutations and returned as a table data structure 68 of the expanded matrix 28. These two data structures 28 and 68 serve as iteration tables in order to create trace events 22 for each test case. The graph-based coherency verification tool 10 is verified for each created trace, that is, the graph-based coherency verification tool 10 is run and checked for a cycle in the graph. All permutations are created, if no specific attributes 32 in the various trace events 22 are defined.

An example algorithm according to an embodiment of a method described herein may be implemented as follows:

Design experts and verification engineers describe failing test cases 20 in the high-level description (HLD) format as a higher level abstraction. The abstraction is provided in a flat file containing basic events as mentioned herein. One scenario is contained in one HLD file 24. The self-checking tool 50, implementing the embodiment of the method, comprises three functions, which are run for each scenario, (i) parsing, (ii) expanding, (iii) iterating.

Details on parsing a HLD file 24 are as follows:

The HLD file 24 is read and processed line after line. Each line 26 may contain exactly one event. One event contains several attributes 32, such as CLASS, TYPE (token type=), TIMESTAMP (token t=), ADDRESS (uppercase character as symbolic address), THREAD (token th=), SEQUENCE_ID (token id=), SOURCE (token src=), as examples. The attribute CLASS, which is the very first token, may be mandatory. It specifies the basic event (NF, XI, FETCH, STORE, UPDATE, etc). If some attributes 32, like TYPE, are not specified in the HLD file 24, the self-checking tool 50 may treat those attributes as NA (=not available) as an indication to create all permutations for that event CLASS later (refer to FIG. 5 for an example). This principle may be applied to further attributes, i.e. permutations may be created for non-specified attributes. The parser designates missing attributes with the value NA. Some attributes may be mandatory, like TIMESTAMP, ADDRESS, SEQUENCE_ID, and SOURCE. If mandatory attributes need to be integrated into the permutation, sets or ranges can be provided. An example for a set may be used with Fetch events, that may read old data from multiple sources. The parser recognizes sets by curly braces and comma delimited tokens. An example for a set would be: SOURCE={PRELOAD@0, NF@100, NF@150, NF@200}. This parsing function returns a matrix data structure 28, which provides row/column access. The matrix 28 in FIG. 6 shows one row 30 per event, the columns show each of the attributes 32 whether it is initialized or NA.

Details on expanding a parsed HLD file 24 are as follows:

With the given HLD file 24, all permutations can now be created based on the attributes 32 provided in the matrix 28. For each row 30 in the matrix 28, the various columns, i.e. the attributes, are processed with respect to NA values and sets or ranges. For example, if a TYPE=NA is found, the self-checking tool 50 will expand the matrix 28 which leads to the creation of a table 68 containing all permutations (refer to FIG. 5 showing an example creation of permutations). For example, a NF of TYPE=NA (not applicable), may result in the creation of all combinations available, since it is not specified (refer to FIG. 5). Likewise, a NF may be of TYPE=EX, then this results in a subset of permutations, i.e. CEX:EX, CEX:EX_PSC, EX:EX, and EX:EX_PSC (compare to FIG. 5 numeral 66, the valid EX responses). For example, if the THREAD=NA, the self-checking tool 50 will run through all available threads, multiplicating the number of tests. This principle may be applied to further attributes, i.e. permutations may be created for non-specified attributes. The attributes TYPE and THREAD are described as examples, but further attributes may be handled by the same principle. One row 70 of the table 68 of the expanded matrix 28 represents one valid mapping of abstract high-level events to specific low-level events. The individual columns of the table 68 correspond to individual rows 30 of the matrix 28, each having an individual CLASS. FIG. 6 shows the permutations of a fully expanded matrix 28 in the table 68. As an example, the NF in row 30 of the matrix 28 consists of a specific command and a specific response, resulting in two columns 101 in the table 68, which corresponds to row 30 of the matrix 28. The column name of the table 68 corresponds to the row index 30 of the matrix 28. In this example, the valid permutations for a NF with TYPE=RO in column 101 of table 68, and the valid permutations for the thread identifiers 102 of a FETCH are shown. The other columns of table 68 correspond to matrix rows in the same way.

Details on iterating are as follows:

Based on the created matrix and table data structures, a main iteration function may be implemented with two nested loops. The outer loop: for each row 70 of the table 68 one trace is created by the self-checking tool 50, the graph-based coherency verification tool 10 is run until the end of the table 68 is reached. For each created trace, a cycle is found or the self-checking tool 50 reports an error. The inner loop: for each row 30 of the matrix 28 the detailed trace events 22 are created with the given values of the table rows 70. The detailed trace events 22 are written to a trace file 12, which is later input to the graph-based coherency verification tool 10. For example, FIG. 6 illustrates how two of the matrix rows, the statements 101, 102, are created. In the first trace file 12 that is generated, the NF 101 in row 30 of matrix 28 is the first event, and will set command=CEX and response=RO. The Fetch is the third event 102 and will set thread=1, etc. The inner loop creates trace events 22 and adds them to the trace file 12 for each CLASS with the syntax that the graph-based coherency verification tool 10 expects. For each CLASS, the format of the table 68 is specified. For example, NF has two table 68 columns (see 101), Fetches and Stores have one table 68 column (see 102). The graph-based coherency verification tool 10 is run after the trace was created. The output files are checked for a cycle, i.e. a coherency violation. If there is no cycle, the self-checking tool 50 will stop and provide the counter example. If all rows of the table 68 were processed, all expanded test cases were run with the graph-based coherency verification tool 10. The self-checking tool 50 may or may not continue with another test case, which is specified in another HLD file.

Figure 7:
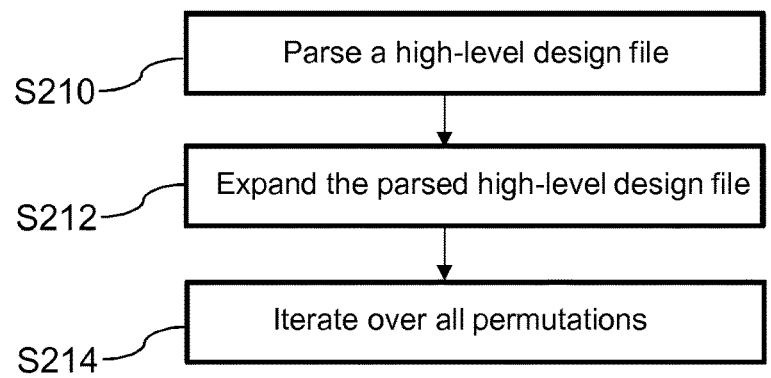
FIG. 7 depicts a flowchart of an implementation according to an embodiment of the invention.

FIG. 7 shows a flowchart of an implementation for processing a test case 20 with the self-checking tool 50, according to an embodiment of the invention. The sequence of the example method after specification of a test case 20 in a high-level description language format, comprises (i) at S210 parsing a high-level design file 24 to an in-memory matrix data structure 28 of the test case 20; (ii) at S212 expanding matrix 28 of the parsed high-level design file 24 to create all permutations of trace events 22 and returning this in table 68; and finally (iii) at S214 iterating over each row 70 of the expanded table 68 using each high-level description row 30 of the matrix 28 to create trace events 22 and storing them to a trace file 12.

Figure 8:
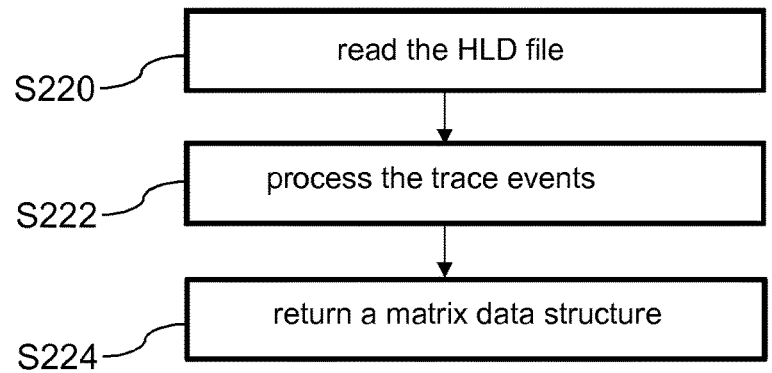
FIG. 8 depicts a flowchart for parsing a high-level description file according to an embodiment of the invention.

FIG. 8 shows a flowchart for parsing a high-level description file 24 according to an embodiment of the invention. The sequence of the example method for parsing a high-level description file 24 comprises (i) at S220 reading the HLD file 24; (ii) at S222 processing each line 26 and reading the attributes 32; and (iii) at S224 returning a matrix data structure 28 with the according attributes 32.

Figure 9:
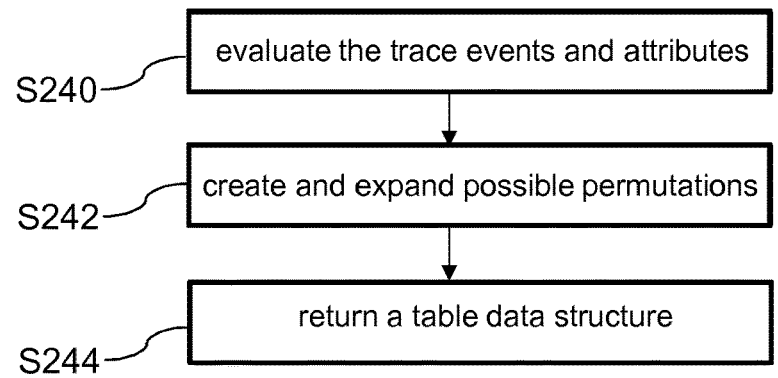
FIG. 9 depicts a flowchart for expanding the parsed high-level description and creating permutations according to an embodiment of the invention.

FIG. 9 depicts a flowchart for expanding the matrix 28 of the parsed high-level description file 24 and creating permutations according to an embodiment of the invention. The sequence of the example method for expanding the parsed high-level description file 24 to create permutations of trace events 22 and returning a table 68 comprises (i) at S240 evaluating the trace events 22 and attributes 32, which are stored in each row 30 of the matrix 28; (ii) at S242 creating all possible permutations for the trace events 22, and creating all possible permutations if attributes are not specified; and (iii) at S244 creating/returning the table rows 70 of table 68 according to the created permutations.

Figure 10:
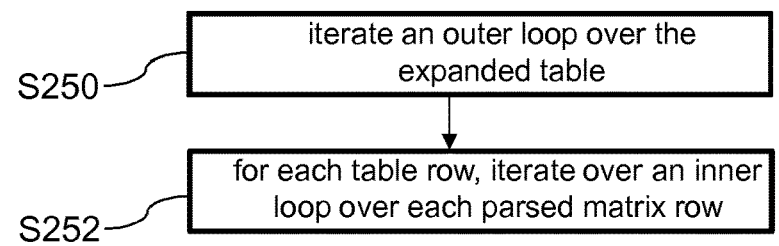
FIG. 10 depicts a flowchart for iterating over the parsed and expanded data structures according to an embodiment of the invention.

In FIG. 10 a flowchart for iterating over the parsed and expanded data structures, comprising permutations based on the high-level description file 24, according to an embodiment of the invention is shown. The main iteration function is implemented with two nested loops: (i) at S250 iterating an outer loop: for each row 70 of the table 68 one trace is created, the graph-based coherency verification tool 10 is run, and a cycle si to be found; and (ii) at S252 iterating an inner loop: for a specific row 70 the detailed trace events of the matrix 28 are created, which are later input to the graph-based coherency verification tool 10.

Figure 11:
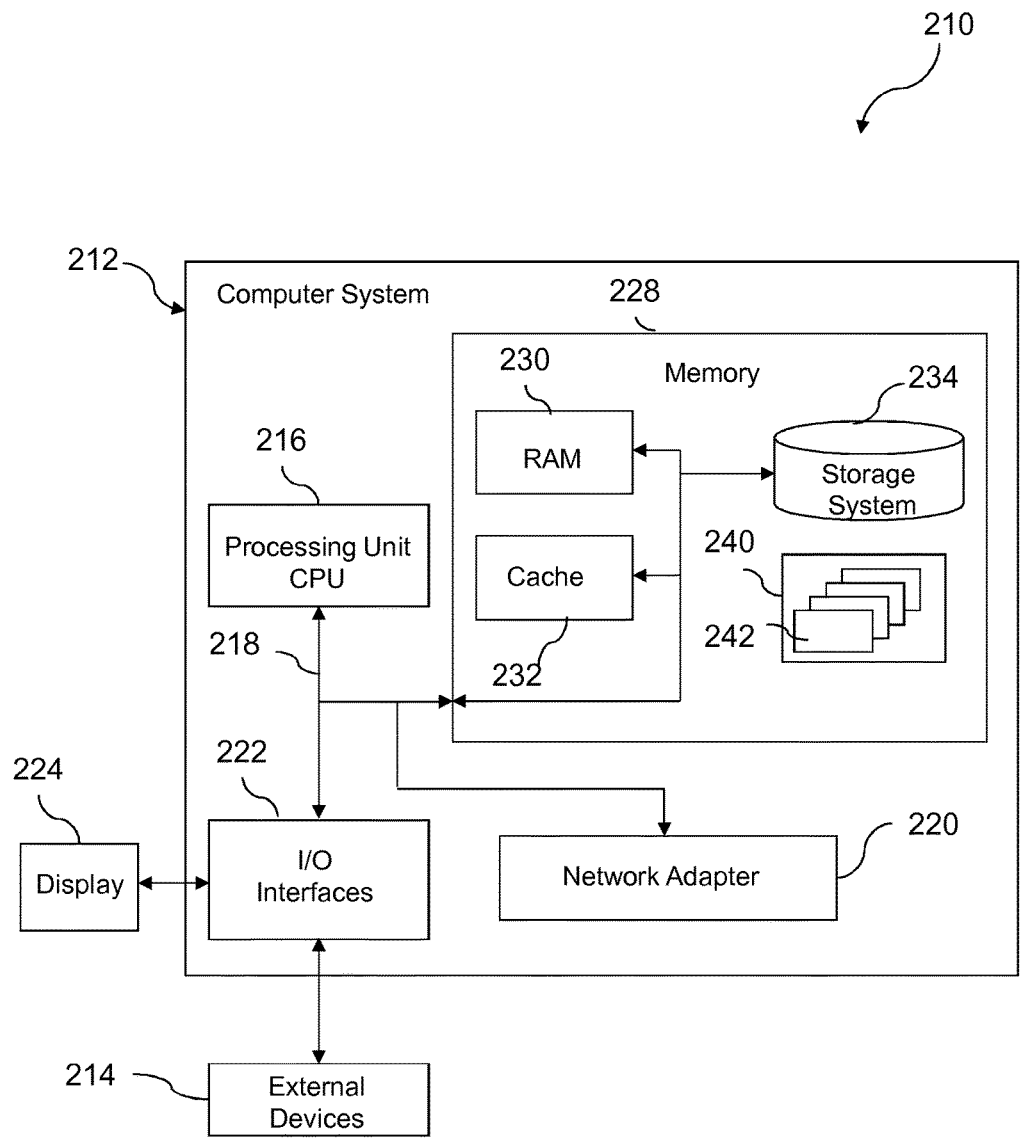
FIG. 11 depicts an example embodiment of a data processing system for carrying out a method according to one or more embodiments of the invention.

Referring now to FIG. 11, a schematic of an example embodiment of a data processing system 210 for carrying out a method according to one or more embodiments of the invention is shown. Data processing system 210 is only one example of a suitable data processing system and is not intended to suggest any limitation as to the scope of use or functionality of embodiments of the invention described herein. Regardless, data processing system 210 is capable of being implemented and/or performing any of the functionality set forth herein.

In data processing system 210 there is a computer system/server 212, which is operational with numerous other general purpose or special purpose computing system environments or configurations. Examples of well-known computing systems, environments, and/or configurations that may be suitable for use with computer system/server 212 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the systems, devices, and the like described herein.

Computer system/server 212 may be described in the general context of computer system executable instructions, such as program modules, being executed by a computer system. Generally, program modules may include routines, programs, objects, components, logic, data structures, and so on that perform particular tasks or implement particular abstract data types. Computer system/server 212 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 11, computer system/server 212 in data processing system 210 is shown in the form of a general-purpose computing device. The components of computer system/server 212 may include, but are not limited to, one or more processors or processing units 216, a system memory 228, and a bus 218 that couples various system components including system memory 228 to processor 216.

Bus 218 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 212 may include a variety of computer system readable media. Such media may be any available media that is accessible by computer system/server 212, and it includes both volatile and non-volatile media, removable and non-removable media.

System memory 228 can include computer system readable media in the form of volatile memory, such as random access memory (RAM) 230 and/or cache memory 232. Computer system/server 212 may further include other removable/non-removable, volatile/non-volatile computer system storage media. By way of example only, storage system 234 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 218 by one or more data media interfaces. As is depicted and described herein, memory 228 may include at least one program product having a set (e.g., at least one) of program modules that are configured to carry out the functions of embodiments of the invention.

Program/utility 240, having a set (at least one) of program modules 242, may be stored in memory 228 by way of example, and not limitation, as well as an operating system, one or more application programs, other program modules, and program data. Each of the operating system, one or more application programs, other program modules, and program data or some combination thereof, may include an implementation of a networking environment. Program modules 242 generally carry out the functions and/or methodologies of embodiments of the invention as described herein. Computer system/server 212 may also communicate with one or more external devices 214 such as a keyboard, a pointing device, a display 224, etc.; one or more devices that enable a user to interact with computer system/server 212; and/or any devices (e.g., network card, modem, etc.) that enable computer system/server 212 to communicate with one or more other computing devices. Such communication can occur via Input/Output (I/O) interfaces 222. Still yet, computer system/server 212 can communicate with one or more networks such as a local area network (LAN), a general wide area network (WAN), and/or a public network (e.g., the Internet) via network adapter 220. As depicted, network adapter 220 communicates with the other components of computer system/server 212 via bus 218. It should be understood that although not shown, other hardware and/or software components could be used in conjunction with computer system/server 212. Examples, include, but are not limited to: microcode, device drivers, redundant processing units, external disk drive arrays, RAID systems, tape drives, and data archival storage systems, etc.

Aspects described herein provide, as examples, methods and systems for verifying a functional correctness of a graph-based coherency verification tool, in order to enable an efficient and optimized way for verification with improved quality of the result. Aspects described herein may be achieved by features of the claims, drawings and/or the specification as disclosed herein.

According to one embodiment, a method is proposed for verifying a functional correctness of a graph-based coherency verification tool for logic designs of arrangements of processors and processor caches. The graph-based coherency verification tool uses trace files as input for verifying memory ordering rules of a given processor architecture for accesses to the caches, wherein nodes in a graph represent memory accesses and edges represent dependencies between them. The method introduces a self-checking tool, wherein the method comprises (i) providing a specification of a test case for the self-checking tool, the test case being a sequence of statements in a high-level description language format, representing memory access events and system events; and (ii) generating trace files with the self-checking tool for the graph-based coherency verification tool by producing all possible permutations of trace events, which are defined by the sequence of statements in the test case.

According to a further embodiment, a data processing program for execution in a data processing system is proposed comprising an implementation of an instruction set for performing a method as described above when the data processing program is run on a computer.

As a further embodiment, a data processing system for execution of a data processing program is proposed, comprising software code portions for performing a method described above.

Further a computer program product is favorably proposed comprising a computer usable medium including a computer readable program, wherein the computer readable program when executed on a computer causes the computer to perform a method for verifying a functional correctness of a graph-based coherency verification tool for logic designs of arrangements of processors and processor caches, the graph-based coherency verification tool using trace files as input for verifying memory ordering rules of a given processor architecture for accesses to the caches, wherein nodes in a graph represent memory accesses and edges represent dependencies between them. The method comprises (i) providing a test case for a self-checking tool, the test case being a sequence of statements in a high-level description language format, representing memory access events and system events; and (ii) generating trace files with the self-checking tool for the graph-based coherency verification tool by producing all possible permutations of trace events, which are defined by the sequence of statements in the test case.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Rash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to block diagrams of methods, apparatus (systems) and computer program products according to embodiments of the invention. It will be understood that each block of the flowchart illustrations and/or block diagrams, and combinations of blocks in the block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the block diagram block or blocks.

The block diagrams in the figures illustrate the architecture, functionality, and operation of possible implementations of systems, methods and computer program products according to various embodiments of the present invention. In this regard, each block in the block diagrams may represent a module, segment, or portion of code, which comprises one or more executable instructions for implementing the specified logical functions. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

What is claimed is:

1. A computer-implemented for improving correctness of a graph-based coherency verification tool and cache coherency reliability, the method comprising:
   verifying a functional correctness of a graph-based coherency verification tool for logic designs of arrangements of processors and processor caches, the graph-based coherency verification tool using trace files as input for verifying memory ordering rules of a given processor architecture for accesses to the caches, wherein nodes in a graph represent memory accesses and edges represent dependencies between the nodes, the verifying comprising:
      providing a specification of a test case for a self-checking tool, the test case comprising a sequence of statements in a high-level description language format, representing memory access events and system events, wherein the test case is a failing scenario; and
      generating trace files with the self-checking tool for the graph-based coherency verification tool by producing permutations of trace events, which are defined by the sequence of statements of the test case.

2. The method of claim 1, wherein the graph-based coherency verification tool is configured for using trace files of simulations of logic descriptions as input.

3. The method of claim 1, wherein the trace events comprise at least one of: a system event, an instruction, μ-operations, a Fetch command, a Store command, a cross invalidate command, or a Nest Fetch command.

4. The method of claim 3, wherein statements of types Fetch and Store represent, respectively, a read and write of a portion of a cache line, statements of type Nest Fetch represent the Fetch of a cache line into the memory hierarchy, and statements of type cross invalidate represent the invalidation of a cache line or a change of the cache line state.

5. The method of claim 1, further comprising:
   parsing a high-level description file comprising the sequence of statements to a matrix data structure of the test case;
   expanding the parsed high-level description file to create the permutations of the trace events defined by the sequence of statements, and returning a table data structure; and
   iterating over the matrix data structure and the table data structure such that the high-level description file expands to the trace files, each comprising several detailed trace events.

6. The method of claim 5, wherein parsing the high-level description file comprises:
   reading the high-level description file;
   processing the trace events defined by the sequence of statements and reading their corresponding attributes; and
   returning the matrix data structure, the matrix data structure comprising rows corresponding to the trace events and corresponding attributes.

7. The method of claim 5, wherein expanding the parsed high-level description file creates variations of the trace events and comprises:
   for each row of the matrix data structure, evaluating the corresponding trace event and attributes;
   creating permutations of the trace events; and
   creating the table data structure from combinations of the created permutations for each trace event, and returning the table data structure containing rows according to the created permutations.

8. The method of claim 5, wherein the iterating comprises:
   iterating over the table data structure in an outer loop to create a trace file for each row of the table data structure; and
   iterating over each row of the matrix data structure an inner loop to create one or more detailed trace events for each row of the matrix data structure, to be input to the graph-based coherency verification tool.

9. The method of claim 1, wherein producing the permutations of the trace events comprises producing all possible permutations of the trace events based on no specific attributes in a trace event being defined.

10. The method of claim 1, wherein the producing the permutation of trace events is based on whether attributes of the trace events are defined.

11. The method of claim 1, wherein the test case is configured to produce at least one error in memory access order indicated by the graph.

12. A computer system for improving correctness of a graph-based coherency verification tool and cache coherency reliability, the computer system comprising:
   a memory; and
   a processor in communication with the memory, wherein the computer system is configured to perform a method comprising:
      verifying a functional correctness of a graph-based coherency verification tool for logic designs of arrangements of processors and processor caches, the graph-based coherency verification tool using trace files as input for verifying memory ordering rules of a given processor architecture for accesses to the caches, wherein nodes in a graph represent memory accesses and edges represent dependencies between the nodes, the verifying comprising:
         providing a specification of a test case for a self-checking tool, the test case comprising a sequence of statements in a high-level description language format, representing memory access events and system events, wherein the test case is a failing scenario; and generating trace files with the self-checking tool for the graph-based coherency verification tool by producing permutations of trace events, which are defined by the sequence of statements of the test case.

13. The computer system of claim 12, wherein the trace events comprise at least one of: a system event, an instruction, p-operations, a Fetch command, a Store command, a cross invalidate command, or a Nest Fetch command.

14. The computer system of claim 12, wherein the method further comprises:

parsing a high-level description file comprising the sequence of statements to a matrix data structure of the test case;

expanding the parsed high-level description file to create the permutations of the trace events defined by the sequence of statements, and returning a table data structure; and iterating over the matrix data structure and the table data structure such that the high-level description file expands to the trace files, each comprising several detailed trace events.

15. The computer system of claim 14, wherein parsing the high-level description file comprises:

reading the high-level description file;

processing the trace events defined by the sequence of statements and reading their corresponding attributes; and returning the matrix data structure, the matrix data structure comprising rows corresponding to the trace events and corresponding attributes.

16. The computer system of claim 12, wherein producing the permutations of the trace events comprises producing all possible permutations of the trace events based on no specific attributes in a trace event being defined.

17. A computer program product for improving correctness of a graph-based coherency verification tool and cache coherency reliability, the computer program product comprising:

a computer readable storage medium readable by a processor and storing instructions for execution by the processor for performing a method comprising:

verifying a functional correctness of a graph-based coherency verification tool for logic designs of arrangements of processors and processor caches, the graph-based coherency verification tool using trace files as input for verifying memory ordering rules of a given processor architecture for accesses to the caches, wherein nodes in a graph represent memory accesses and edges represent dependencies between the nodes, the verifying comprising:

providing a specification of a test case for a self-checking tool, the test case comprising a sequence of statements in a high-level description language format, representing memory access events and system events, wherein the test case is a failing scenario; and generating trace files with the self-checking tool for the graph-based coherency verification tool by producing permutations of trace events, which are defined by the sequence of statements of the test case.

18. The computer program product of claim 17, wherein the trace events comprise at least one of: a system event, an instruction, µ-operations, a Fetch command, a Store command, a cross invalidate command, or a Nest Fetch command.

19. The computer program product of claim 17, wherein the method further comprises:

parsing a high-level description file comprising the sequence of statements to a matrix data structure of the test case;

expanding the parsed high-level description file to create the permutations of the trace events defined by the sequence of statements, and returning a table data structure; and iterating over the matrix data structure and the table data structure such that the high-level description file expands to the trace files, each comprising several detailed trace events.

* * * * *